US009558970B2

(12) United States Patent
Huisstede et al.

(10) Patent No.: US 9,558,970 B2
(45) Date of Patent: Jan. 31, 2017

(54) DEVICE AND METHOD FOR DRYING SEPARATED ELECTRONIC COMPONENTS

(75) Inventors: Jurgen Hendrikus Gerhardus Huisstede, Goor (NL); Wilhelmus Johannes In Den Bosch, Nijmegen (NL)

(73) Assignee: Besi Netherlands B.V., Duiven (NL)

( * ) Notice: Subject to any disclaimer, the term of this patent is extended or adjusted under 35 U.S.C. 154(b) by 1125 days.

(21) Appl. No.: 12/992,970

(22) PCT Filed: May 25, 2009

(86) PCT No.: PCT/NL2009/050288
§ 371 (c)(1),
(2), (4) Date: Jan. 26, 2011

(87) PCT Pub. No.: WO2009/145623
PCT Pub. Date: Dec. 3, 2009

(65) Prior Publication Data
US 2011/0113645 A1    May 19, 2011

(30) Foreign Application Priority Data

May 30, 2008   (NL) ..................................... 2001642

(51) Int. Cl.
*F26B 3/00* (2006.01)
*H01L 21/67* (2006.01)
*F26B 5/16* (2006.01)
*H01L 21/673* (2006.01)
*H01L 21/683* (2006.01)

(52) U.S. Cl.
CPC ........... *H01L 21/67028* (2013.01); *F26B 5/16* (2013.01); *H01L 21/67034* (2013.01); *H01L 21/67046* (2013.01); *H01L 21/67092* (2013.01); *H01L 21/67336* (2013.01); *H01L 21/6838* (2013.01)

(58) Field of Classification Search
CPC ........ B24B 37/30; B05C 5/0208; F26B 21/14;
F26B 3/347; F26B 5/048; F26B
5/16; F26B 9/003; H01L 21/67028; H01L
21/67051; H01L 31/0236; H01L 31/048
USPC .... 34/352; 438/28, 424, 478, 758, 108, 113,
438/149, 26, 270, 407, 427, 437, 455, 46,
464, 438/473, 475, 530, 584, 66, 666, 7,
710, 780, 438/786, 85, 95
See application file for complete search history.

(56) References Cited

U.S. PATENT DOCUMENTS

| 5,737,846 | A  | * | 4/1998 | Warren et al. ..................... 34/71 |
| 5,933,902 | A  | * | 8/1999 | Frey ................................. 15/102 |
| 6,187,654 | B1 | * | 2/2001 | Tieber ................. B28D 5/0094 |
|           |    |   |        | 257/E21.599 |
| 6,544,590 | B1 | * | 4/2003 | Kodera et al. ................ 427/350 |

(Continued)

FOREIGN PATENT DOCUMENTS

| DE | 102005057109 A1 | 5/2007 |
| JP | 6104376 A | 4/1994 |

(Continued)

*Primary Examiner* — Kenneth Rinehart
*Assistant Examiner* — Jason Lau
(74) *Attorney, Agent, or Firm* — The Webb Law Firm

(57) ABSTRACT

The invention relates to a device for at least partially drying separated electronic components comprising: a carrier for the electronic components; a moisture-absorbing material; and a holder covered with the moisture-absorbing material, wherein the holder and the carrier are displaceable relative to each other such that the electronic components for drying can be brought into contact with the moisture-absorbing material.

7 Claims, 2 Drawing Sheets

(56) References Cited

U.S. PATENT DOCUMENTS

| | | |
|---|---|---|
| 6,951,042 B1* | 10/2005 | Mikhaylichenko ....... B08B 1/04 |
| | | 15/102 |
| 2002/0049026 A1* | 4/2002 | Katagiri et al. ................ 451/41 |
| 2003/0200994 A1* | 10/2003 | Bailey ............................ 134/16 |
| 2005/0221725 A1* | 10/2005 | Nakamura et al. ............ 451/41 |
| 2006/0062955 A1* | 3/2006 | Liu et al. ..................... 428/40.1 |
| 2006/0088982 A1 | 4/2006 | Boyd et al. |
| 2007/0074361 A1 | 4/2007 | Gavney, Jr. |
| 2007/0139857 A1* | 6/2007 | Watanabe et al. ............ 361/234 |
| 2008/0087399 A1* | 4/2008 | Masaki .................. D21F 1/483 |
| | | 162/363 |
| 2009/0032492 A1* | 2/2009 | Kunze-Concewitz .......... 216/13 |

FOREIGN PATENT DOCUMENTS

| | | |
|---|---|---|
| JP | 2002353169 A | 12/2002 |
| KR | 1020030068740 | 2/2002 |
| KR | 1020060054806 | 11/2004 |
| WO | 2006036126 A1 | 4/2006 |

\* cited by examiner

DEVICE AND METHOD FOR DRYING SEPARATED ELECTRONIC COMPONENTS

BACKGROUND OF THE INVENTION

1) Field of the Invention

The present invention relates to a device and method for drying separated electronic components.

2) Description of the Prior Art

During the process of manufacturing electronic components, such as more particularly semiconductor products, these are usually separated (which can also be referred to as singulated or divided) from a larger unit of electronic components. The electronic components are usually manufactured in a larger unit of electronic components. Examples hereof are for instance packages with a plurality of encapsulated electronic components, and wafers. During separation use is generally made during machining processes of flushing liquid, although the separation can also take place using a cutting liquid. For the least possible impact on the processing steps following separation, it is desirable that the separated electronic components are dried before they are subjected to other processing steps.

It is known here to make use of a device according to the preamble of claim 1. In such devices the separated electronic components are placed on the carrier, after which they are brought into contact with a moisture-absorbing material arranged on a holder by the holder and the carrier being displaced relative to each other. In the known cases the holder is here a roller and the carrier a surface, wherein the roller and the separated electronic components are displaced relative to each other. Such devices have the drawback however that the moisture-absorbing material loses its effect after a period of time because it becomes saturated with absorbed moisture. As soon as the moisture-absorbing material is saturated, the device can no longer carry out its function properly, and there is the danger of the electronic components being subjected to a subsequent processing step when not completely dry.

It is an object of the present invention to provide a device for at least partially drying separated electronic components which at least partially obviates the above stated drawbacks.

SUMMARY OF THE INVENTION

The invention provides for this purpose a device of the above described type, characterized by suction means for suctioning absorbed moisture out of the moisture-absorbing material. Because the moisture is suctioned out of the moisture-absorbing material, this material does not become saturated, and it can be used for sustained drying of separated electronic components. Separated electronic components can thus be dried effectively for a longer period of time, at higher production speeds and with relatively little chance of disruption. In addition, suctioning of the moisture out of the moisture-absorbing material also has a further advantage. Suctioning moisture out of the moisture-absorbing material, instead of for instance displacing moisture by scraping, evaporation or blowing, ensures that the conditions in the space in which the separated electronic components are located can be better controlled; this is because the moisture is removed by suctioning and is therefore no longer a factor in the vicinity of the electronic components.

The suction means are preferably adapted to apply an underpressure relative to the pressure in a space in which the moisture-absorbing material is located. An airflow is in this way generated, using which airflow the moisture absorbed from the separated electronic components by the moisture-absorbing material is carried out of the space. A substantial part of the moisture which is present will already evaporate due to the displacement of air in the moisture-absorbing material.

Favourable results are obtained when the underpressure is 100-300 mbar lower than the pressure in the space in which the moisture-absorbing material is located. At such a pressure difference a good suctioning of the moisture is achieved without this resulting in undesirable side-effects, such as for instance excess airflow whereby the separated electronic components are displaced in undesirable manner. The thickness of the moisture-absorbing material is preferably 1-10 mm. It is not only the pressure difference which can be determined subject to situational conditions; there are also other variables which can be adjusted as required. Examples of such variables are, among others, the suction flow rate and the temperature.

In an advantageous embodiment of the present invention the holder is provided with at least one moisture-permeable segment connecting to the moisture-absorbing material. Such a moisture-permeable segment of the holder makes it possible to suction moisture out of the moisture-absorbing material through the holder. The moisture is hereby suctioned out of the moisture-absorbing material from a direction remote from the side of the moisture-absorbing material with which it makes contact with the separated electronic components. The moisture is in this way carried through the moisture-absorbing material; the moisture-absorbing material functions here as a kind of filter. A significant advantage of this construction is that the moisture-absorbing material prevents strong gas flows coming into contact with the separated electronic components. The suction means will here also be situated on the side of the carrier remote from the moisture-absorbing material. The term "be situated" is here also understood to mean "debouch". A pump can thus be connected by means of a channel or hose to the side of the carrier remote from the moisture-absorbing material.

During the contact with the separated electronic components the moisture-absorbing material can also remove dirt and/or dust particles from the components as well as moisture. The moisture-absorbing material thus fulfils a dual function; not only does it have a drying function, it also acts simultaneously as cleaning means. The dirt and/or dust taken up by the moisture-absorbing material can be suctioned out of the moisture-absorbing material in order to thus prevent increasing contamination of the moisture-absorbing material. Conversely, it is also possible to apply the moisture-absorbing material as "dirt filter". This will particularly be the case if the suctioning takes place from the side of the moisture-absorbing material opposite the side with which the moisture-absorbing material makes contact with the electronic components. If the contamination of the moisture-absorbing material reaches an undesirable level, the moisture-absorbing material will have to be replaced or cleaned (compare this to a contaminated filter which is changed or cleaned).

In a further embodiment of the present invention the holder is substantially cylindrical, wherein the moisture-absorbing material engages in the form of a cylinder jacket round an outer side of the holder. The moisture absorbed from the separated electronic components can hereby be suctioned via the interior of the holder. The holder with a covering of moisture-absorbing material in the form of a cylinder jacket can be rolled over the electronic components.

In an alternative embodiment the holder is substantially flat and the moisture-absorbing material is pushed onto the separated electronic components such that they are as it were tamponed for the purpose of absorbing moisture. Recesses are usually arranged in the flat carrier, thereby ensuring the position of the electronic components on the carrier. These recesses usually connect to an underpressure system whereby the electronic components can be held in the openings through support from an underpressure.

In a particular embodiment variant of the device the carrier is provided with recesses for at least partially receiving the electronic components, wherein the openings are connected to an underpressure system, wherein a layer of moisture-absorbing material is received in the openings. With this embodiment variant drying can also take place on the side of the electronic components directed toward the carrier. Due to the suctioning through the moisture-absorbing material placed in the openings of the carrier the moisture will also be suctioned out of this moisture-absorbing material.

At an advantageous size of the pores of the moisture-absorbing material the diameter of these pores amounts to 100-200 micron.

The moisture-permeable segment of the holder adjoining the moisture-absorbing material can have a grid structure, optionally in combination with holes arranged in the holder. For a sufficient discharge of moisture through the carrier, 30 to 70% of the area of the permeable segment is open.

The present invention also comprises a method for at least partially drying separated electronic components, comprising the processing steps of: A) providing on a carrier a number of separated electronic components lying in one plane; B) bringing the separated electronic components into contact with a moisture-absorbing material; and C) suctioning moisture present in the moisture-absorbing material out of the moisture-absorbing material using suction means. The moisture can here be suctioned out of the moisture-absorbing material from the side along which it has previously been absorbed by the moisture-absorbing material, although it is also possible for the moisture to be suctioned out of the moisture-absorbing material from a side opposite the side along which it has previously been absorbed by the moisture-absorbing material. Another advantageous option is that a cylindrical outer side of the moisture-absorbing material is rolled over the separated electronic components for drying. In yet another embodiment variant moisture is also absorbed by the carrier by means of moisture-absorbing material connected to the carrier. For the advantages of this method reference is made to the advantages already described above of the device according to the present invention. It is of course also possible to subsequently dry the electronic components on two sides, although for this purpose the separated electronic components will then have to be taken from the carrier by means of a gripper element (manipulator) such that the side of the electronic components initially directed toward the carrier also becomes accessible to moisture-absorbing material.

BRIEF DESCRIPTION OF THE DRAWINGS

The invention will now be elucidated on the basis of the following non-limitative exemplary embodiments. Herein.

DETAILED DESCRIPTION OF THE PREFERRED EMBODIMENTS

Figure 1:
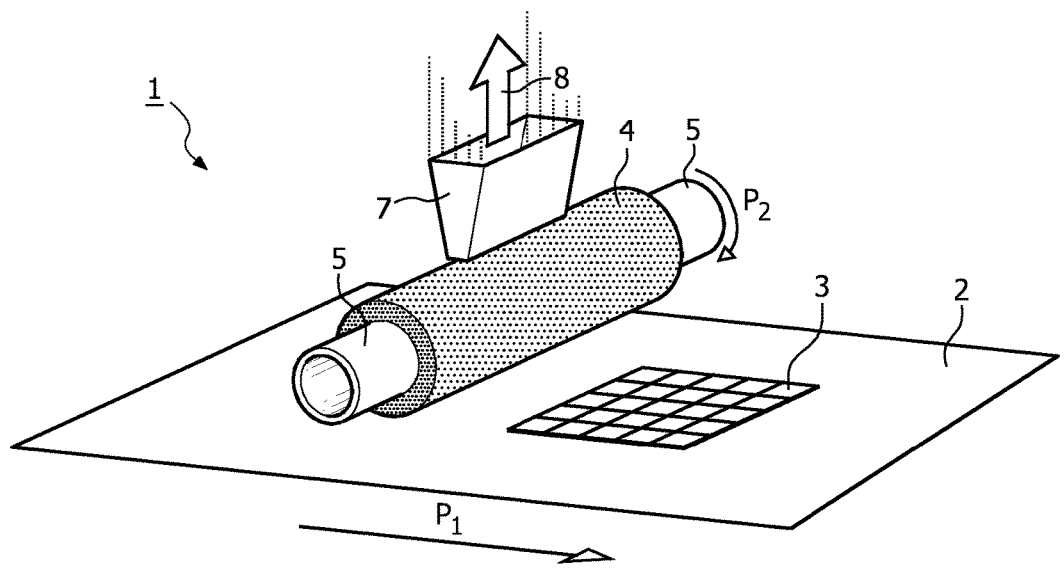
FIG. 1 is a perspective view of a schematically represented device according to the present invention.

FIG. 1 shows a schematic view of a device 1 for drying separated electronic components 3 provided with a flat carrier 2 on which the electronic components 3 are located. Device 1 is also provided with a moisture-absorbing material 4 arranged round a part of the outer wall of a cylindrical holder 5. Holder 5 and carrier 2 can be displaced relative to each other in or opposite to the direction of arrow $P_1$. The moisture-absorbing material 4 on holder 5 can be brought into contact with electronic components 3 located on carrier 2 by rolling holder 5 with moisture-absorbing material 4 over electronic components 3 (see arrow $P_2$). Disposed above holder 5 with moisture-absorbing material 4 is a suction nozzle 7 for suctioning absorbed moisture out of moisture-absorbing material 4. This moisture is further discharged using an airflow 8.

Figure 2:
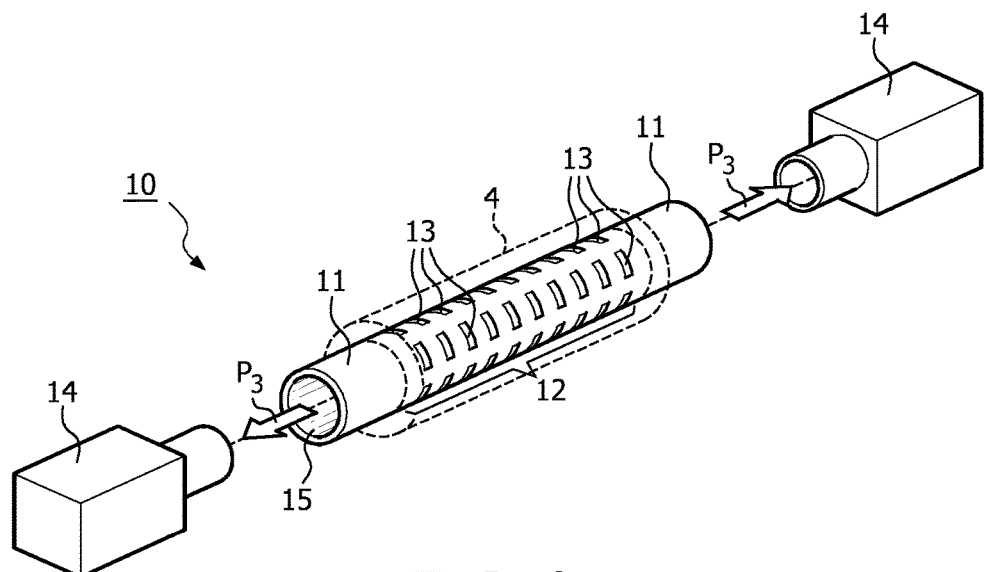
FIG. 2 is a partially cut-away view of a schematically represented alternative embodiment of a device according to the present invention.

FIG. 2 shows a roller 10 which can form part of a second embodiment of a device according to the invention. Moisture-absorbing material 4 is designated with the same reference numeral as in FIG. 1. Roller 10 consists of a tubular carrier 11, the outer side of which is partially enclosed by moisture-absorbing material 4. Tubular carrier 11 is provided with a gas and moisture-permeable segment 12. Openings 13 are arranged for this purpose in tubular carrier 11. There are diverse alternatives, such as grids and gauze, as alternative to the gas and moisture-permeable openings 13. Suction means 14 represented highly schematically connect to the hollow interior 15 of tubular carrier 11. Suction means 14 can generate an underpressure in the hollow interior 15 of tubular carrier 11 such that gas flows are created as according to arrows $P_3$. The arrows $P_3$ in FIG. 2 show that the suction means connect on two sides to the hollow interior 15 of tubular carrier 11, although it is of course also possible for the suctioning to take place from only one of the two sides. Such a single-sided suctioning is structurally simpler. Gas (generally air) is suctioned out of the atmosphere for the purpose of generating the gas flows. Gas is suctioned out of the atmosphere surrounding roller 10 and flows as according to arrows $P_3$ through moisture-absorbing material 4 and openings 13 in tubular carrier 11 to suction means 14. Moisture present in moisture-absorbing material 4 is entrained by these gas flows $P_3$. Moisture-absorbing material 4 hereby dries and desirably does not become saturated, whereby a continuous absorption of moisture can take place. Roller 10 will be pressed with a limited pressure (preferably only several Newton) against the electronic components for drying (not shown) and then rolled thereover.

Figure 3:
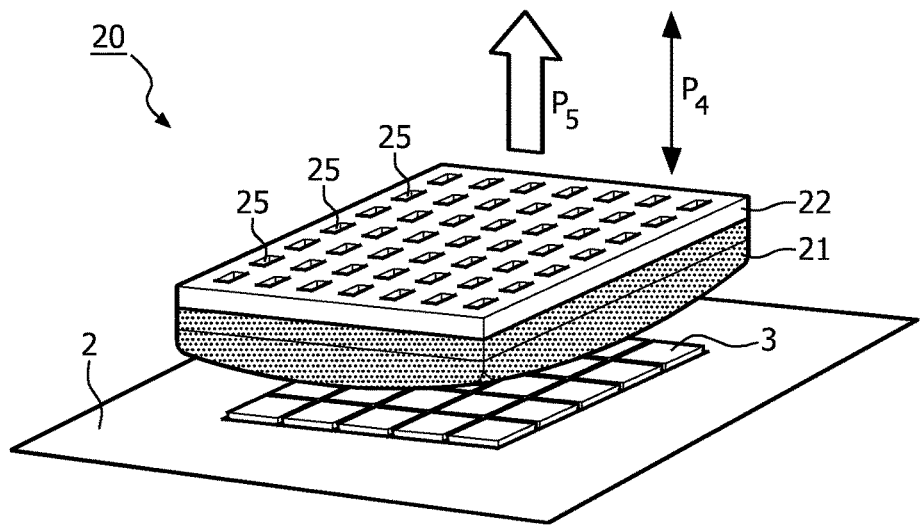
FIG. 3 is a perspective view of a third embodiment of a device according to the present invention.

FIG. 3 shows a third embodiment of a device 20 according to the present invention. In this embodiment moisture-absorbing material 21 is arranged on a flat holder plate 22. Holder plate 22 with moisture-absorbing material 21 can be moved intermittently (see arrow $P_4$) relative to electronic components 24 located on a carrier 23 such that electronic components 24 are dried by means of tamponing. Arranged in holder plate 22 are openings 25 through which a gas flow can be generated (see arrow $P_5$), whereby in this variant the gas flow is also suctioned through moisture-absorbing material 21. At least a part of the moisture present in moisture-absorbing material 21 will here be entrained in gas flow $P_5$, as a result of which the moisture-absorbing material 21 dries and desirably does not become saturated.

Figure 4A:
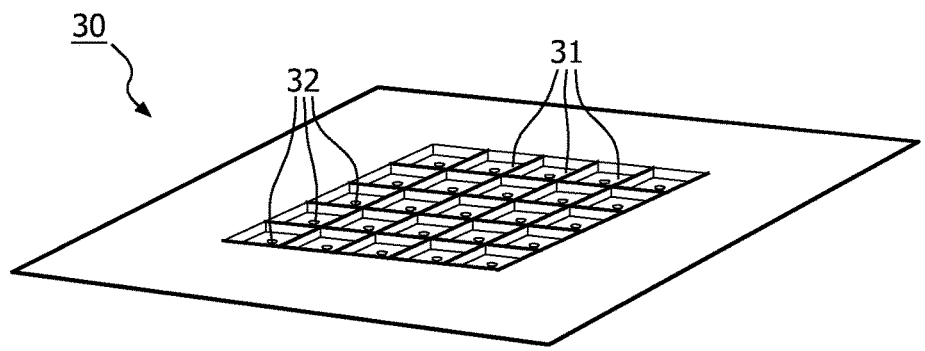
FIGS. 4A-C show diverse views of a carrier, and a component of such a carrier, as can be applied in an alternative embodiment variant of the device according to the present method.
Figures 4B, 4C:
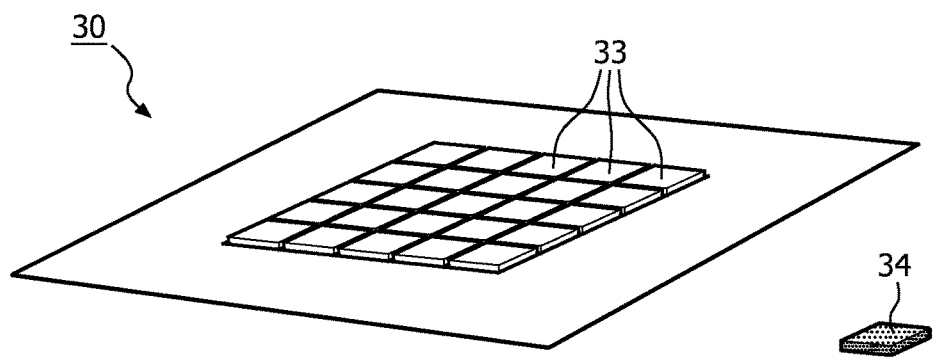

FIG. 4A shows a schematic view of a carrier 30 in which a number of recesses 31 are arranged. Recesses 31 are adapted to the dimensioning of a specific size of electronic component such that these latter can be placed in recesses 31. Connecting to each opening 31 is a suction opening 32, whereby the components can be held more firmly in openings 31 using underpressure. FIG. 4B shows carrier 30 in a situation where separated electronic components 33 have been placed in the openings. Electronic components 33 protrude here to a limited extent above carrier 30. In this situation electronic components 33 can be dried on the side remote from carrier 30 by being brought into contact with a moisture-absorbing material as shown for instance in the foregoing figures. FIG. 4C shows a segment 34 of a moisture-absorbing material which has dimensions such that it can be placed in an opening 31 of carrier 30. Segments 34 of moisture-absorbing material are here desirably placed in openings 31 of carrier 30 such that they are not unintentionally released when electronic components 33 are taken out of openings 31. The segments 34 of moisture-absorbing material thus arranged in openings 31 will, if they are so dimensioned that they make contact with the underside (the side directed toward carrier 30) of electronic components 33, will also dry the underside of components 33. Moisture will be suctioned out of segments 34 of moisture-absorbing material as a result of the suction of gas through suction opening 32 such that it is possible to prevent the segments 34 of moisture-absorbing material becoming saturated with moisture.

In addition to the shown embodiments, diverse variations are possible in the form of the holder and the moisture-permeable parts. The moisture-absorbing material can consist of a variety of materials, such as for instance a hydrophilic foam, a PVA sponge or polyurethane.

The invention claimed is:

1. A device for at least partially drying separated electronic components, comprising
    a carrier for the electronic components;
    a moisture-absorbing material; and
    a holder holding the moisture-absorbing material;
    wherein the holder is substantially flat with openings through which gas flow can be generated;
    wherein the holder and the carrier are displaceable relative to each other such that the electronic components for drying can be brought into contact with the moisture-absorbing material, and each of the openings of the holder and the recesses of the carrier are in alignment with each other;
    wherein the device is also provided with suction device for suctioning absorbed moisture out of the moisture-absorbing material;
    wherein the carrier is provided with recesses for at least partially receiving the electronic components and a layer of moisture-absorbing material is received in the recesses;
    wherein the moisture-absorbing material received in the recesses is selected from the group consisting of hydrophilic foams, including sponges made of polyvinyl alcohol and/or polyurethane; and
    wherein the recesses are connected to an underpressure system that removes moisture and dirt from the moisture-absorbing material received in the recesses.

2. The device as claimed in claim 1, wherein the moisture-absorbing material is provided with pores with a diameter of 100-200 micron.

3. A method for at least partially drying separated electronic components, comprising the processing steps of:
    A) providing on a carrier a number of separated electronic components lying in one plane;
    B) bringing the separated electronic components into contact with a moisture-absorbing material, wherein the moisture absorbing material is held in place by a holder that is substantially flat with openings through which gas flow can be generated; and
    C) suctioning moisture present in the moisture-absorbing material out of the moisture-absorbing material using a suction device,
    wherein the carrier also absorbs moisture by means of a flexible moisture-absorbing material disposed in recesses provided in the carrier, which recesses are connected to an underpressure system that removes moisture and dirt from the moisture-absorbing material received in the recesses,
    wherein each of the openings of the holder and the recesses of the carrier are in alignment with each other.

4. The method as claimed in claim 3, wherein the moisture is suctioned out of the moisture-absorbing material from a side proximate to the holder and opposite the side along which it has previously been absorbed by the moisture-absorbing material.

5. The method as claimed in claim 3, wherein during the contact with the separated electronic components the moisture-absorbing material also removes dirt and/or dust particles from the electronic components as well as moisture.

6. The method as claimed in claim 3, wherein the carrier also absorbs moisture by means of moisture-absorbing material connected to the carrier.

7. The device as claimed in claim 1 wherein the recesses are aligned in a matrix of at least two columns and two rows.

* * * * *